(12) United States Patent
Vilander

(10) Patent No.: US 7,378,781 B2
(45) Date of Patent: May 27, 2008

(54) ACOUSTIC WAVE RESONATOR WITH INTEGRATED TEMPERATURE CONTROL FOR OSCILLATOR PURPOSES

(75) Inventor: Ari Vilander, Kerava (FI)

(73) Assignee: Nokia Corporation, Espoo (FI)

( * ) Notice: Subject to any disclaimer, the term of this patent is extended or adjusted under 35 U.S.C. 154(b) by 95 days.

(21) Appl. No.: 11/221,656

(22) Filed: Sep. 7, 2005

(65) Prior Publication Data

US 2007/0052327 A1 Mar. 8, 2007

(51) Int. Cl.
*H01L 41/08* (2006.01)
(52) U.S. Cl. ............... 310/343; 310/315; 310/320; 310/341
(58) Field of Classification Search ............ 310/313 R, 310/320, 315, 341, 343
See application file for complete search history.

(56) References Cited

U.S. PATENT DOCUMENTS

| | | | | |
|---|---|---|---|---|
| 3,758,830 A | * | 9/1973 | Jackson | 257/419 |
| 5,003,822 A | * | 4/1991 | Joshi | 73/204.23 |
| 5,200,714 A | * | 4/1993 | Hayashi | 331/66 |
| 5,273,608 A | | 12/1993 | Nath | |
| 5,283,458 A | * | 2/1994 | Stokes et al. | 257/416 |
| 5,289,075 A | * | 2/1994 | Besson et al. | 310/367 |
| 5,587,620 A | * | 12/1996 | Ruby et al. | 310/346 |
| 5,641,611 A | | 6/1997 | Shieh et al. | |
| 5,952,778 A | | 9/1999 | Haskal et al. | |
| 5,992,215 A | * | 11/1999 | Caron et al. | 73/24.01 |
| 6,103,541 A | | 8/2000 | Yang et al. | |
| 6,133,674 A | * | 10/2000 | Fry | 310/343 |
| 6,147,565 A | * | 11/2000 | Satoh et al. | 331/70 |
| 6,333,458 B1 | | 12/2001 | Forrest et al. | |
| 6,352,777 B1 | | 3/2002 | Bulovic et al. | |
| 6,420,031 B1 | | 7/2002 | Parthasarathy et al. | |
| 6,440,769 B2 | | 8/2002 | Peumans et al. | |
| 6,451,415 B1 | | 9/2002 | Forrest et al. | |
| 6,507,983 B1 | * | 1/2003 | Ruby et al. | 29/25.35 |
| 6,580,027 B2 | | 6/2003 | Forrest et al. | |
| 6,657,378 B2 | | 12/2003 | Forrest et al. | |
| 6,660,930 B1 | | 12/2003 | Gonsiorawski | |
| 6,710,508 B2 | * | 3/2004 | Ruby et al. | 310/312 |
| 6,794,020 B2 | | 9/2004 | Cotlear de Witzmann et al. | |
| 6,828,728 B2 | | 12/2004 | Ishii et al. | |

(Continued)

FOREIGN PATENT DOCUMENTS

EP  0834989 A2  4/1998

(Continued)

OTHER PUBLICATIONS

International Search Report dated Dec. 8, 2006, Application No. PCT/US2006/033323 filed Aug. 25, 2006.

(Continued)

*Primary Examiner*—Thomas M. Dougherty

(57) ABSTRACT

The present invention relates to a resonator structure, temperature compensation method and temperature control apparatus for controlling local temperature of a resonator structure. At least one heating element (55) is integrated on a substrate of the resonator structure, and a temperature control signal generated based on a stored temperature characteristic is applied to the at least one integrated heating element (55). Thereby, the at least one heating element (55) and an optional integrated sensing element can be provided very close to the resonator. It is thus possible to control or calibrate variations of sensing elements, heating elements and resonator out from every sample.

8 Claims, 5 Drawing Sheets

U.S. PATENT DOCUMENTS

| | | |
|---|---|---|
| 6,845,778 B2 * | 1/2005 | Boyd et al. .................. 134/1.3 |
| 6,885,150 B2 | 4/2005 | Guenther |
| 7,071,598 B2 * | 7/2006 | Satoh ......................... 310/343 |
| 2002/0051894 A1 | 5/2002 | Yoshikawa |
| 2002/0100753 A1 * | 8/2002 | Johnsgard et al. ....... 219/468.1 |
| 2004/0119403 A1 | 6/2004 | McCormick et al. |
| 2005/0110007 A1 | 5/2005 | Forrest et al. |
| 2005/0110598 A1 | 5/2005 | Larson, III .................. 333/191 |

FOREIGN PATENT DOCUMENTS

| | | |
|---|---|---|
| EP | 0962999 A2 | 12/1999 |
| WO | WO 2004/045101 | 5/2004 |
| WO | WO 2004/057674 | 7/2004 |

OTHER PUBLICATIONS

Peumans et al., "Efficient photon harvesting at high optical intensities in ultrathin organic double-heterostructure photovoltaic diodes", App. Phys. Lett. 76, 2650-2652, 2000.

Miessler et al., "Inorganic Chemistry", Chapter 13, $2^{nd}$ Edition, Prentice Hall, 1999.

U.S. Appl. No. 10/910,371, filed Aug. 4, 2004.

U.S. Appl. No. 10/915,410, filed Aug. 11, 2004.

U.S. Appl. No. 10/979,145, filed Nov. 3, 2004.

U.S. Appl. No. 10/857,747, filed Jun. 1, 2004.

Al-Ibrahim et al., "Efficient large-area polymer solar cells on flexible substrates", App. Phys. Lett. 85(9): 1481-1483, 2004.

Weaver et al., "Organic light-emitting devices with extended operating lifetimes on plastic substrates", App. Phys. Lett. 81(16): 2929-2931, 2002.

"Low Noise, Low Jitter Hybrid Ovenized SAW Oscillators", Adler et al., 2000 IEEE Ultrasonics Symposium. pp. 25-28.

"Acoustic Bulk Wave Composite Resonators", Applied Physics Letters, vol. 38, No. 3, pp. 125-127, Feb. 1, 1981.

"Air-Gap Type Rezoelectric Composite Thin Film Resonator", 15 proc. $39^{th}$ Annual Symposium Freq. Control, pp. 361-366, 1985, Satoh et al.

* cited by examiner

ACOUSTIC WAVE RESONATOR WITH INTEGRATED TEMPERATURE CONTROL FOR OSCILLATOR PURPOSES

FIELD OF THE INVENTION

The present invention relates to a resonator structure integrated on a substrate. In particular the present invention relates to film bulk acoustic wave resonator (FBAR) or surface acoustic wave (SAW) resonator structures.

BACKGROUND OF THE INVENTION

The development of mobile telecommunications continues towards ever smaller and increasingly complicated handheld units or mobile phones. The development has recently led to new requirements for handheld units, namely that the units should support several different standards and telecommunications systems. Supporting several different systems requires several sets of filters and other radio frequency (RF) components in the RF parts of the handheld units. Despite this complexity, the size of a handheld unit should not increase as a result of such a wide support.

RF filters used in prior art mobile phones are usually discrete surface acoustic wave (SAW) or ceramic filters. This approach has been adequate for single standard phones, but does not allow support of several telecommunications systems without increasing the size of a mobile phone.

Surface acoustic wave (SAW) resonators utilize surface acoustic vibration modes of a solid surface, in which modes the vibration is confined to the surface of the solid, decaying quickly away from the surface. A SAW resonator typically comprises a piezoelectric layer and two electrodes. Various resonator structures such as filters are produced with SAW resonators. A SAW resonator has the advantage of having a very small size, but unfortunately cannot withstand high power levels.

It is known to construct thin film bulk acoustic wave (BAW) resonators on semi-conductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125-127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", 15 Proc. 39th Annual Symp. Freq. Control, pp. 361-366, 1985, by Hiroaki Satoh, Yasuo Ebata, Hitoshi Suzuki, and Choji Narahara, a BAW resonator having a bridge structure is disclosed. Examples of BAW resonator circuits are also disclosed in EP-A-0962999 and EP-A-0834989.

BAW resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

FIG. 1 shows a cross section of a conventional BAW resonator isolated from a substrate 30 (e.g. an Si-substrate) by an acoustic mirror structure 18. The BAW resonator comprises a bottom electrode BE, a piezoelectric layer or film 160, and a top electrode TE. The acoustical mirror structure 18 comprises in this example three layers. Two of the layers are formed of a first material, and the third layer in between the two layers is formed from a second material. The first and second materials have different acoustical impedances. The order of the materials can be different in different examples. In some examples, a material with a high acoustical impedance can be in the middle and a material with a low acoustical impedance on both sides of the middle material. In other examples, the order can be opposite. The bottom electrode BE may in some embodiments function as one layer of the acoustical mirror.

In FIG. 1, the active part 16 of the BAW resonator is indicated by the dashed rectangle. This BAW resonator is based on an SMR (Solid Mounted Resonator) structure, where reflection is made by the mirror structure 18 under the active part. The electronic characteristic between the bottom electrode BE and the substrate 30 can be represented by a bottom electrode parasitic circuit BEP which comprises a series connection of parasitic capacitors CoxM1 to CoxM3 at the acoustical mirror structure 18, followed by a parallel circuit of a substrate resistor RsuM and a substrate capacitor CsuM. Furthermore, resistors Rsb and Rst represent ohmic resistances of the respective conductor paths between the bottom electrode BE and a bottom electrode terminal 24 and between the top electrode TE and a top electrode terminal 22. The electronic characteristic between the top electrode TE and the substrate 30 can be represented by a top electrode parasitic circuit TEP which comprises a series connection of a parasitic capacitor CoxT and a parallel circuit of a substrate resistor RsuT and a substrate capacitor CsuT. Moreover, a parasitic capacitance Ctb is provided between the top electrode TE and the bottom electrode BE. Thus, the electrodes of the conventional BAW resonator are slightly different because the bottom electrode BE has more parasitic capacitance than the top electrode TE.

The temperature drift of BAW resonators is approx. −20 ppm/° C. The usable mobile temperature range is −30° C. to +85° C., so that frequency drift could be as much as 2000 ppm respectively. If the center frequency of oscillator is for example 1 GHz, then the drift will be 2.0 MHz.

Quite many implementations need more accurate frequency than referred to above, such as for example in case of a reference oscillator adapted for mobile use. Temperature compensation can be achieved, if the dependency or relationship between frequency and temperature is well known. However, when a mobile phone is switched on, temperature and oscillator frequency are unknown parameters.

Document US2005/0110598A1 discloses a temperature-compensated FBAR device, where an integrated temperature-compensating element having a temperature coefficient opposite in sign to the temperature coefficient of a piezoelectric element of the active part is provided for temperature compensation purposes. Additionally, document U.S. Pat. No. 6,710,508B2 discloses an FBAR device in which resonant frequencies are adjusted by intentionally inducing oxidation at an elevated temperature.

Furthermore, different separate temperature control components, not integrated with an acoustic resonator of an SAW oscillator to be compensated, are described in "Low Noise, Low Jitter Hybrid Ovenized SAW Oscillators", J. V. Adler et al, IEEE ULTRASONICS SYMPOSIUM, pp 25-28, 2000.

SUMMARY OF THE INVENTION

It is an object of the present invention to provide a resonator structure with improved frequency accuracy.

This object is achieved by a resonator structure integrated on a substrate and comprising:

an acoustically active part;

first and second electrodes arranged on opposite sides of said acoustically active part; and at least one controllable heating element integrated on said substrate, and configured to supply heat to said resonator structure.

Furthermore, the above object is achieved by a temperature control apparatus for controlling local temperature of a resonator structure, the apparatus comprising:

memory means for storing information about a temperature characteristic of said resonator structure; and control means for generating a temperature control signal based on said stored information, and for applying said control signal to an integrated heating element of said resonator structure.

Additionally, the above object is achieved by a method of compensating temperature variations in a resonator structure, the method comprising the steps of:

integrating at least one heating element on a substrate of the resonator structure;

applying a temperature control signal to the at least one integrated heating element to obtain a temperature characteristic; and storing the temperature characteristic of the resonator structure.

Accordingly, at least one integrated heating element is provided on the substrate of the resonator structure, so that the heating element is located very close to the resonator structure itself. The temperature control is thus quite accurate and variation of heating elements and resonator can be individually calibrated for every resonator sample.

The controllable heating element may be configured to be used as a temperature sensing element for sensing local temperature of the resonator structure. As an alternative or additional measure, at least one dedicated temperature sensing element may be integrated on the substrate and configured to sense local temperature of the resonator structure. This provides the advantage that the dependency or characteristic between frequency and temperature of the resonator structure can be measured continuously and the stored characteristic can be adapted at a predetermined timing.

As an example, the temperature sensing element may comprise at least one doped region of the substrate. Similarly, the at least one controllable heating element may comprise at least one doped region of the substrate.

The at least one controllable heating element may comprises at least one metal strip pattern integrated on the substrate. Of course, any other structure or pattern, such as a thin film or thick film or semiconductor pattern or the like may be used to obtain the integrated heating element.

The resonator structure may be a BAW resonator structure or a SAW resonator structure or any other integrated resonator structure with an acoustically active part.

Furthermore, the control means of the temperature control apparatus may be adapted to read values of sampling points at a predetermined timing, and to update the stored information using the read values.

The temperature characteristic may be derived from sampling points measured during manufacture of the resonator structure. A sensed temperature value obtained from an optional temperature sensing element may be used to update the stored temperature characteristic at a predetermined timing.

Further advantageous modifications are described below.

BRIEF DESCRIPTION OF THE DRAWINGS

The present invention will now be described based on embodiments with reference to the accompanying drawings in which.

DESCRIPTION OF THE EMBODIMENTS

In the following, embodiments of the present invention will be described in more detail based on specific BAW and SAW resonator structures.

There are a two implementation examples where the embodiments described hereinafter can be used. Firstly in a reference oscillator, to replace a conventional crystal, and secondly in local oscillator circuits for transmission/reception (TX/RX) frequency generation. Both cases require an accurate and well-defined temperature behavior. The pure resonator is useful directly for oscillator purposes, so that the present invention enables more accurate oscillator circuits.

In particular, the below embodiments could be used in a crystal-less oscillator used as a reference oscillator circuit of an RF transceiver as described for example in WO2004/045101A1 and which can be used in mobile phones or mobile terminals for wireless networks The preferred first embodiment relates to a BAW structure, particularly a Solidly Mounted Resonator (SMR) structure for use e.g. in an oscillator circuit with differential topology. The differential topology is more robust and not as sensitive as a single-end topology where one port or terminal of the resonator structure is connected to a fixed potential. In particular, the first embodiments may be focused on a use of the SMR structure as an oscillator tank circuit. This kind of oscillator is commonly useful for reference purposes, when phase noise requirements are very tight. Thereby, conventional crystal-based oscillators can be replaced by BAW-based oscillators.

However, the first embodiment may as well be implemented in an FBAR structure. In the present specification, the designation "FBAR" is intended to define a topology, where both sides of active parts are isolated with air. Thus, in FBAR structures, active parts are arranged in a floating manner between two air cavities.

According to the first embodiment, at least one first doped region of the substrate of the resonator structure is provided as a heating element of a control circuit for controlling the temperature of the resonator structure. Additionally, the at least one first doped region may by used as a sensor element for measuring local temperature at the resonator structure. As an alternative, at least one second doped region of said substrate may be provided as a sensor element (such as a sensor diode) for measuring local temperature at the resonator structure.

Figure 1:
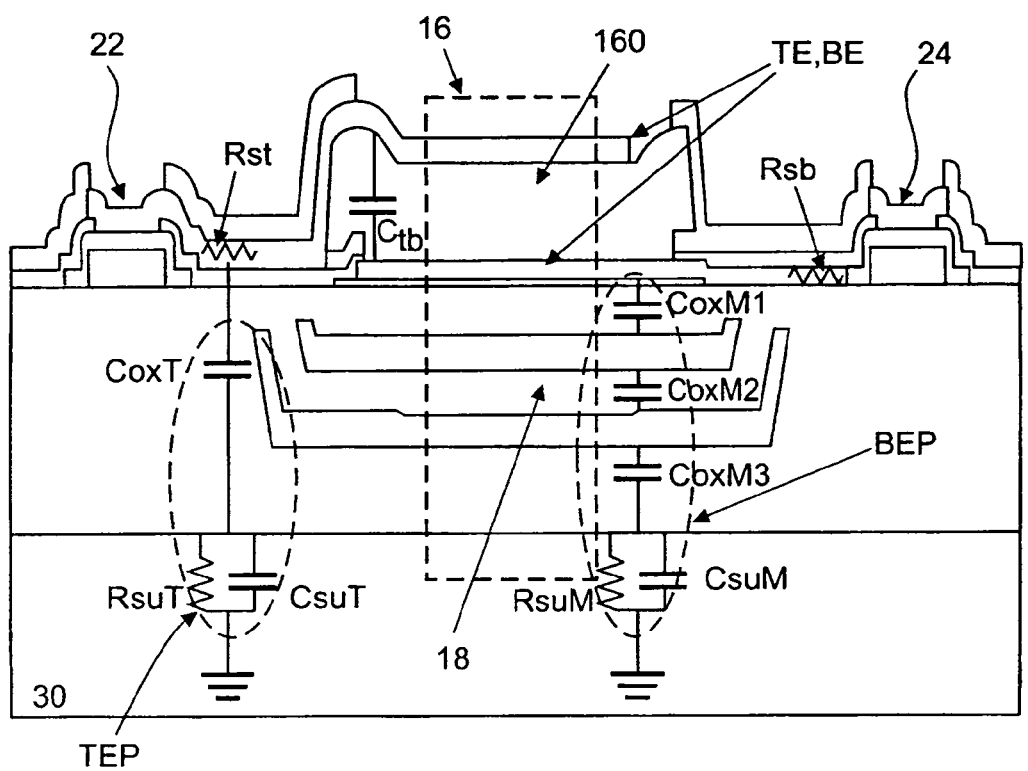
FIG. 1 shows a schematic cross section of a conventional resonator structure.
Figure 2:
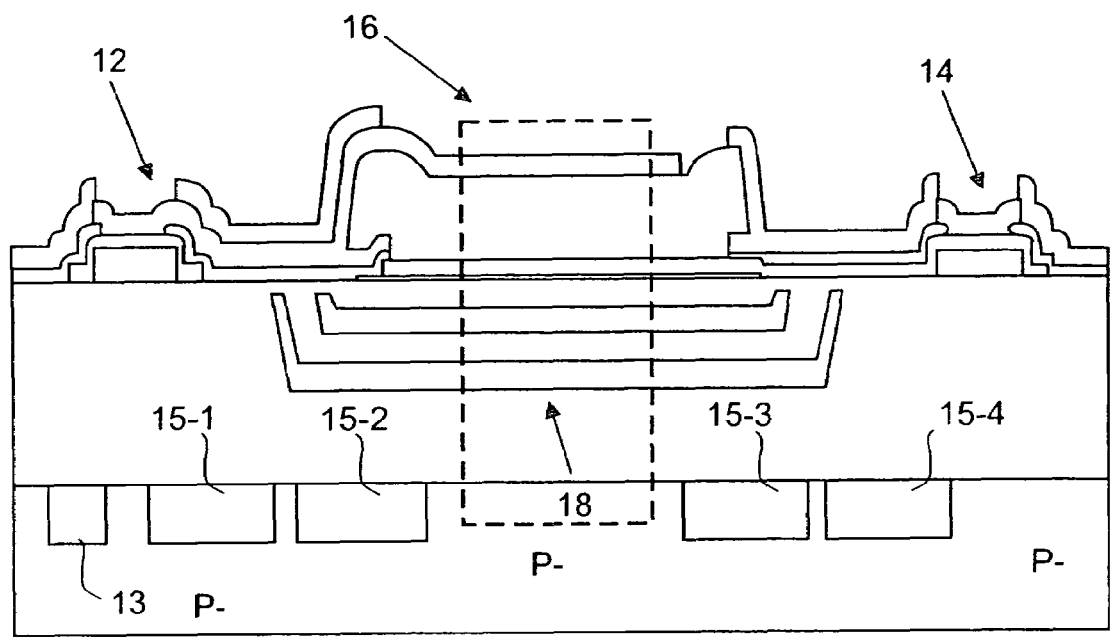
FIG. 2 shows a schematic cross section of a resonator structure with temperature drift compensation according to a first embodiment.

FIG. 2 shows a schematic cross section of a BAW resonator similar to FIG. 1 with additional temperature drift compensation. In particular, a heating-type drift compensation for a BAW resonator is shown. As an example, four heating resistors 15-1 to 15-4 are provided in the substrate below the integrated BAW resonator structure and function as diffusion resistors. Furthermore, a sensor diode 13 can be added to measure the temperature of the BAW resonator structure. Both heating resistors 15-1 to 15-4 and sensor diode 13 may be obtained by providing N+ doped regions in a P-doped substrate. The sensor diode 13 is used as a forward biased diode. A constant current is driven or flows through the sensor diode 13 and a voltage drop at the sensor diode 13 is detected and compared to a reference voltage. Based on the comparison result, a predetermined heating current or voltage is applied to the heating resistors so as to heat the BAW resonator structure to a predetermined temperature value which corresponds to the reference voltage. Thereby, the BAW resonator structure can be controlled to maintain a predetermined temperature and thus a predetermined center frequency. The required control parameters (e.g. reference voltage, center frequency etc.) can be programmed or stored during the manufacturing process of the BAW resonator structure.

Figure 3:
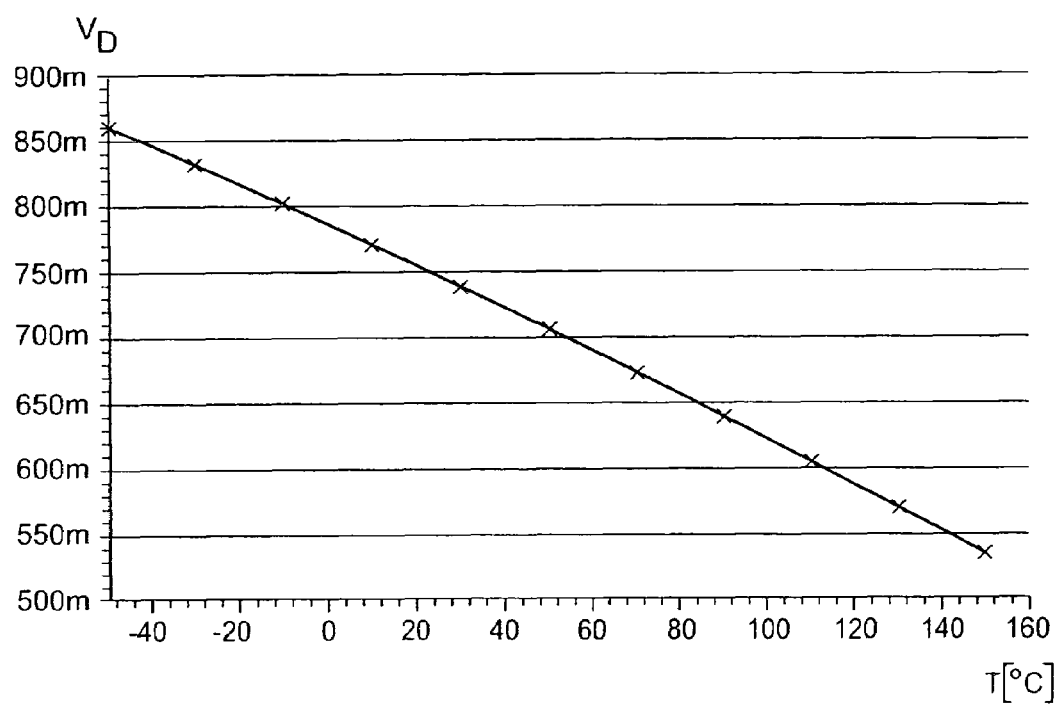
FIG. 3 shows a schematic diagram indicating a temperature behavior of a diode voltage.

FIG. 3 shows a schematic diagram of a temperature dependency of the diode voltage (threshold voltage) $V_D$ of the sensor diode 13 at a constant feed forward current (bias current) of e.g. 50 μA. The selected current value depends on the size of sensor diode 13. As can be gathered from FIG. 3, the substantially linear temperature dependency provides for relatively accurate temperature measurements in the linear range of the diagram.

As already mentioned, the temperature drift compensation, which may be a touch temperature compensation of a mobile phone or other mobile communication device, may be implemented by a doped N region provided below or near the BAW resonator structure and used as the sensor diode 13 for sensing the temperature. Additionally, another or other doped N region(s) is(are) provided below or near the BAW resonator structure as heating elements or resistors 15-1 to 15-4 to increase the temperature of the BAW resonator structure and optionally to control frequency of the BAW resonator structure.

The heating elements or resistors 15-1 to 15-4 may advantageously be used to set temperature of the resonator structure on factory line for enabling an accurate frequency calibration. Additionally, thereby gathered sampling points over the performed temperature sweep, for example from +20 deg C. up to +100 deg C., could be stored to a memory as an RAM. Same kind of calibration could further be used, when a frequency drift outside the control range takes place, then a re-calibration may be done during service or by implemented self-calibration functionality. Thus, it would also be possible to take into account frequency drifts, which are due to aging. Another application of the heating elements or resistors 15-1 to 15-4 may be to heat the resonator structure during normal use. For instance, when ambient temperature of the mobile is low (e.g. −30 deg C.) it would be possible to keep the temperature by heating of the resonator structure at room temperature, that is around +20 deg C. and where the lowest sampling point during fabrication of the mobile on factory line might have been read. Then, there would be no need for any calibration at temperatures lower than room temperature. In particular, the resonator structure needs no freezing during factory line calibration.

As an alternative example, a doped N region may be provided as a resistor element below or near the BAW resonator structure, which resistor element serves both as heating element and sensing element for measuring the local temperature based on its temperature coefficient.

When a mobile phone is switched on, temperature and oscillator frequency are unknown parameters, so that initial compensation is a problem. A solution could be an accurate preliminary temperature measurement and estimation of parameters of the oscillator from a table stored in a memory, e.g., a Random Access Memory (RAM) or the like. As an alternative solution, a forced temperature can be applied to the BAW resonator.

Figure 4:
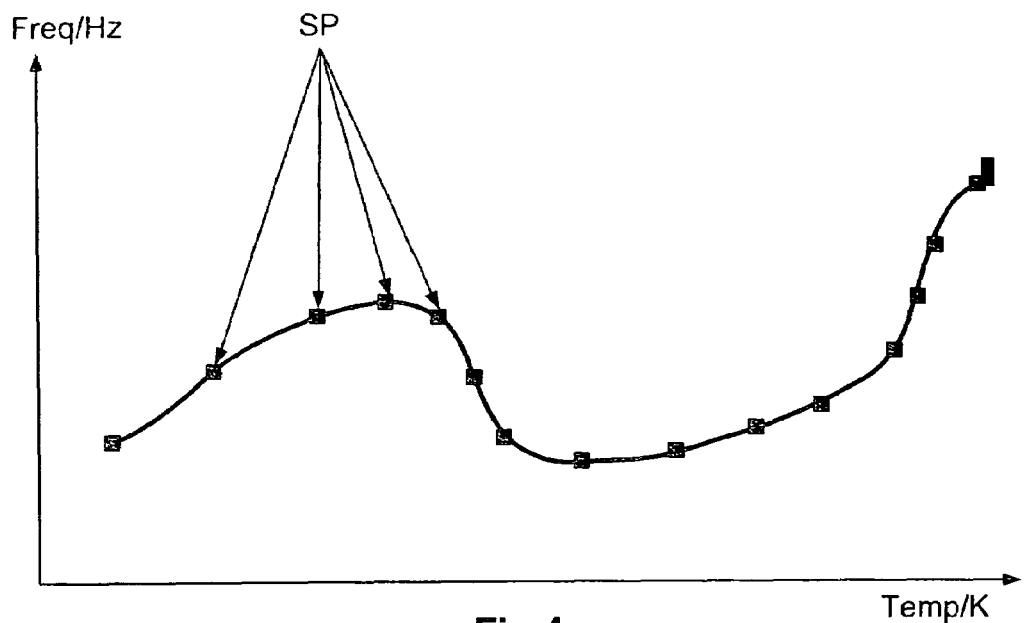
FIG. 4 shows a schematic characteristic indicating a temperature dependency of a resonator frequency.

FIG. 4 shows a schematic characteristic indicating an exemplary temperature dependency of a resonator frequency. This characteristic curve can be sampled at predetermined sampling points SP. The number of sampling points can be selected arbitrarily, e.g. as many as needed. Due to the fact that the heating element(s) and sensor element(s) are integrated close to the resonator itself, all heating power is focused directly to the resonator structure. Sampling can thus be done with a fast power sweep over the whole desired temperature range. The obtained sampling points can be stored in a memory device (e.g. RAM table) provided at a temperature control unit (as explained later).

An alternative approach for obtaining a symmetrical resonator structure may be used, wherein two resonator structures (each structured as shown in FIG. 2) are combined to obtain a symmetrical overall resonator structure as a differential tank circuit, which can be used in differential circuit environments. The two resonator structures can be connected to each other in an anti-parallel manner. That is, the bottom electrode of a first temperature-controlled resonator structure is connected to the top electrode of a second temperature-controlled resonator structure and vice versa. The first and second resonator structures may be integrated on the same substrate.

As another alternative, the two resonator structures (each structured as shown in FIG. 2) are connected to each other in an anti-serial manner. That is, the bottom electrodes of a first resonator structure is connected to the bottom electrode of a second resonator structure and two respective ports are provided at the respective top electrodes. Again, the first and second temperature-controlled resonator structures may be integrated on the same substrate, so that deviation of center frequency is as small as possible.

The proposed temperature-controlled BAW structure may be incorporated in an oscillator bridge configuration comprising a first and second differential transistor pairs. The resonator structure may then be connected in a differential topology and diagonally across the bridge configuration at the source terminals of the transistor pairs. This example is suitable for a parallel mode oscillator, where the BAW structure is operated at its parallel resonance. A current source is provided to generate a bias current for the differential transistor pairs. Differential oscillator types are more robust to environmental changes.

The temperature-controlled BAW structure according to the above first embodiment can be fabricated on silicon (Si), gallium arsenide (GaAs), glass, or ceramic substrates. One ceramic substrate type, which is widely used, is alumina. Furthermore, it can be manufactured using various thin film manufacturing techniques, such as for example sputtering, vacuum evaporation or chemical vapor deposition.

The resonance frequency may range for example from 0.5 GHz to several GHz, depending on the size and materials of the BAW structure. BAWs exhibit the typical series and parallel resonances of crystal resonators. The resonance frequencies are determined mainly by the material of the resonator and the dimensions of the layers of the resonator.

The piezoelectric layer or film 160 of the active part(s) may be for example, ZnO, AlN, ZnS or any other piezoelectric material (or combination of them since temperature behavior is possible to control with two different piezoelectric materials) that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zircon ate titanate family can be used.

The material used to form the electrode layers can be an electrically conductive material having a high acoustic impedance. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta).

The acoustical isolation, as obtained by the acoustic mirror structure 18 of the above embodiments, can be obtained for example by alternative techniques, such as a substrate via-hole or a micromechanical bridge structure. However, the invention is not limited to these three techniques, since any other way of isolating the resonator from the substrate can be used as well.

In the via-hole and bridge structures of FBAR-type resonators, the acoustically reflecting surfaces are the air interfaces below and above the FBAR structure. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure.

The acoustic mirror structure performs the isolation by reflecting the acoustic wave back to the resonator structure. The acoustical mirror 18 of the embodiments typically comprises several layers having a thickness of one quarter wavelength at the center frequency, alternating layers having differing acoustical impedances. The number of layers in an acoustic mirror is an odd integer, typically ranging from three to nine. The ratio of acoustic impedance of two consecutive layers should be large in order to present as low an acoustic impedance as possible to the FBAR, instead of the relatively high impedance of the substrate material. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustic mirror structure, the resonator is isolated from the substrate and the substrate is not modified very much, a wide variety of materials can be used as a substrate.

The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

In the following, the second preferred embodiment is described on the basis of an SAW resonator technology. SAW resonator devices exhibit good Q factor in the range of approximately 5000 to 8000, sometimes even over 10000, which means that good selectivity can be achieved due to steep filter flanks. The temperature dependence of SAW resonator devices is of a second-order type.

Figure 5:
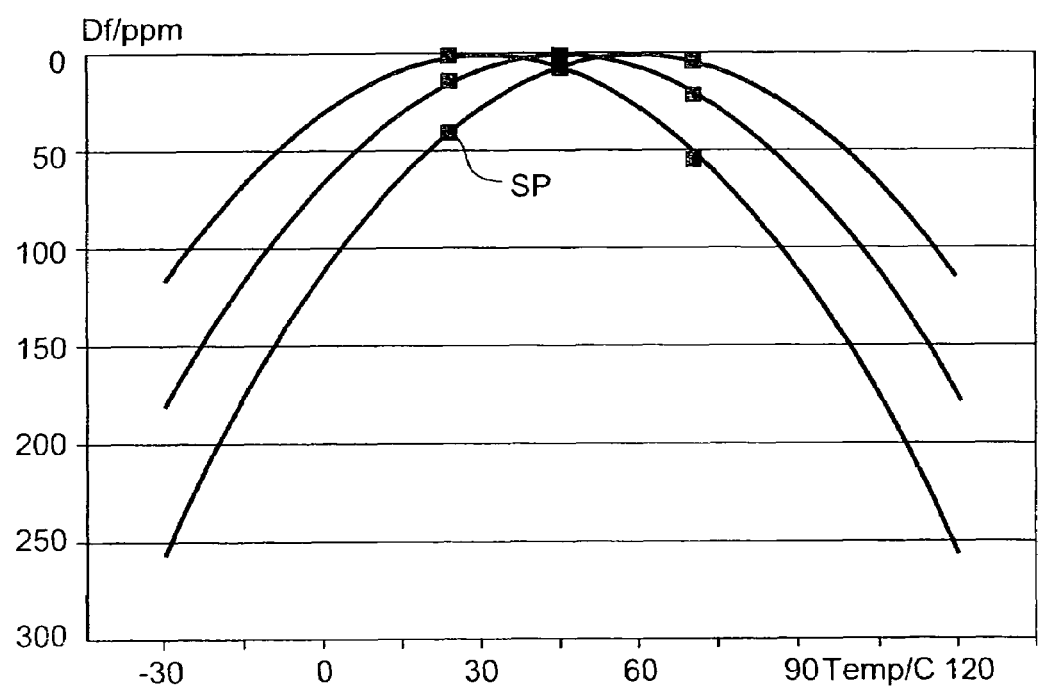
FIG. 5 shows a schematic diagram indicating temperature-dependent variation of turnover point of an SAW resonator.

FIG. 5 shows a schematic diagram indicating temperature-dependent variation of turnover point of an SAW resonator device. The vertical axis indicates the frequency variation Df in ppm (parts per million) and the horizontal axis indicates the temperature measured in ° C. In the example of FIG. 5, three parabolic turnover curves are shown, which represent a temperature variation from +30° C. to +60° C. Specifically, the left turnover curve relates to a resonator operating temperature of +30° C., the middle turnover curve relates to a resonator operating temperature of +45° C., and the right turnover curve relates to a resonator operating temperature of +60° C.

In the present second embodiment, a similar temperature control or compensation as in the first embodiment can be implemented. The interior temperature of the SAW resonator, e.g. substrate or active part, is controlled based on predetermined sampling points SP measured or obtained from the temperature characteristic of the SAW resonator device. In FIG. 5, a number of fictional sampling points SP is shown. Based on a couple of such sampling points SP it is possible to model the whole temperature dependency of the SAW resonator device. The sampling points SP can be obtained during manufacturing of the SAW resonator device in factory or from time to time during usage by the end user. Thereby, temperature curves based on which temperature control is achieved can be calibrated once during manufacturing and/or periodically during usage.

Figure 6:
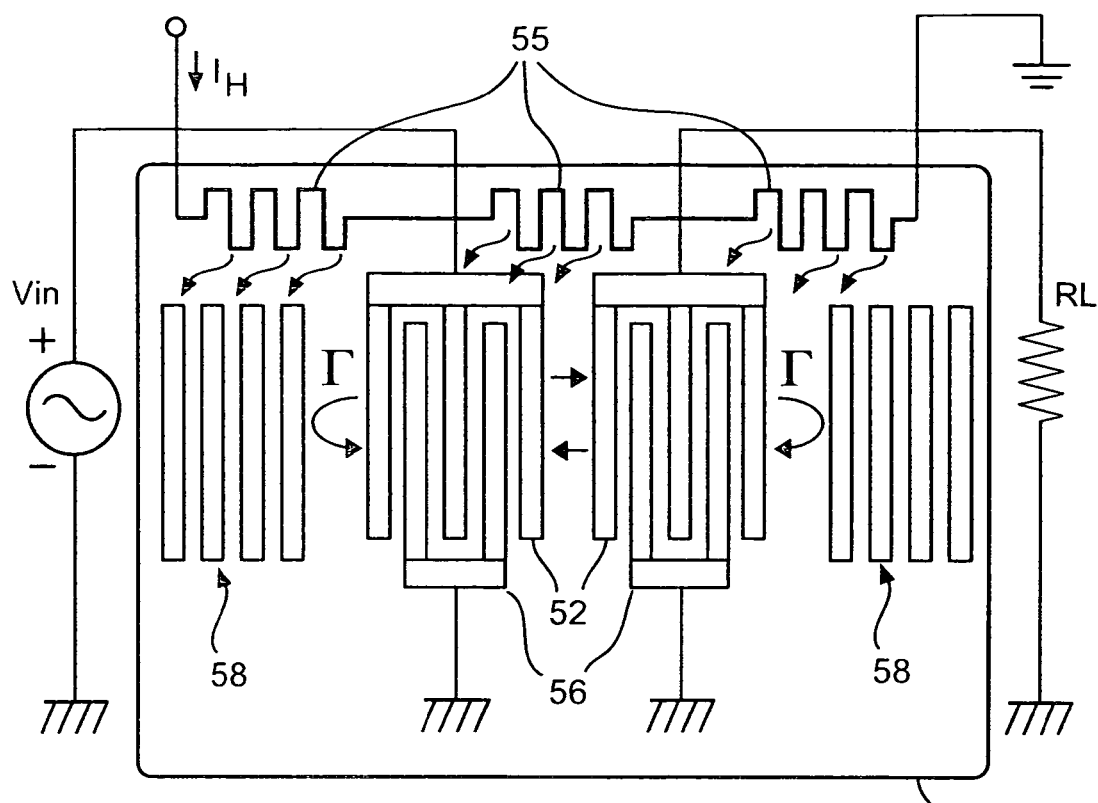
FIG. 6 shows a schematic circuit diagram of an SAW resonator with temperature drift compensation according to a second embodiment.

FIG. 6 shows a schematic circuit diagram of an SAW resonator with temperature drift compensation according to a second embodiment. In the example of FIG. 6, one possible example of integrated heating elements 55 is shown. Both the number and type of heating elements may vary in the second embodiment and of course also in the first embodiment. In the present exemplary case, three heating elements 55 are provided, which are made of metal strips arranged in a meander pattern on a substrate 50 which may be made of a piezoelectric material. The metal strip itself can also be used as a temperature sensor, because its resistance depends on the temperature.

Specifically, the resistance of the metal strip can be calculated as follows:

$$R = \rho \cdot \frac{l}{A}$$

where R denotes the resistance [ohm], $\rho$ denotes the resistivity [$\Omega$m] of the metal, l denotes the length of strip [m], and A denotes cross-sectional area [$mm^2$]. The temperature dependency of the resistivity $\rho$ can be expressed as follows:

$$\rho = \rho_0 \cdot [1 + \alpha \cdot (t - t_{nom})]$$

where $\alpha$ denotes the temperature factor of resistivity [1/° C.], t designates the temperature [° C.], and $t_{nom}$ designates a nominal reference temperature (i.e. room temperature of 20° C.). E.g., $\rho = 27.2\text{e-}9$ $\Omega$m and $\alpha = 4\text{e-}3$ 1/° C. in case of aluminum.

Based on the above equations, the required size and/or structure of the heating elements 55 can be determined to obtain desired heat generating and heat sensing capabilities. The heating elements can be supplied with a heating current $I_H$, which may be controlled based on the stored temperature characteristic obtained e.g. from the sampling points SP. In the present example, the heating elements 55 are connected in series. However, they may as well be connected in parallel and/or to a predetermined heating voltage.

According to FIG. 6, an input voltage Vin of the resonator device is applied to a first comb-shaped electrode pattern 52 which together with an interlaced second comb-shaped electrode pattern 56 forms a first inter digital transformer (IDT). The first IDT 56 converts the electrical signal into a mechanical vibration or wave which propagates as a surface acoustic wave r in opposite directions along the substrate 50. One component of the acoustic wave which propagates to the left side is reflected back at a first reflection pattern 58 and propagates in the opposite direction. The other component which originally propagates in the right direction passes a second IDT which also consists of first and second interlaced comb-shaped electrode patterns 52, 56 and is converted back into an electrical current signal supplied to a load resistor RL which may represent the input impedance of a following processing stage. Having passed the second IDT, the second component of the surface acoustic wave is also reflected at a second reflector pattern 58 at the right end of the substrate 50. Thereby, two components are continuously reflected back and forth and interact with each other in an active part between the two TDTs in a positive or negative manner depending on their frequency. Only at a predetermined resonance frequency, positive interaction generates a resonance effect and the resonator transfers energy to its output. Otherwise, the two wave components suppress each other so that no or only a weak output signal is generated at the right IDT.

By suitable control of the heating current supplied to the heating elements 55, the substrate temperature can be controlled to compensate temperature drifts of the SAW resonator.

The above temperature-controlled resonator structures according to the first and second embodiments can be implemented, for example, in a receiver part of a mobile communication means where an oscillator block may comprise an oscillator circuit with a temperature-controlled resonator structure according to the above first and second embodiments. The temperature-controlled BAW and SAW resonators according to the first and second embodiments may be located on a separate chip next to an RF chip of the mobile communication means or they may be flipped over the RF chip.

Figure 7:
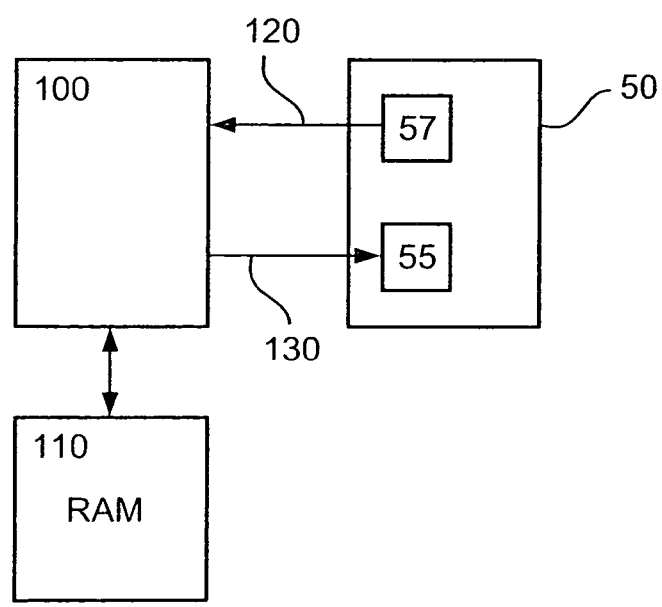
FIG. 7 shows a schematic block diagram of a temperature control arrangement according to the first and second embodiments.

FIG. 7 shows a schematic block diagram of a temperature control arrangement according to the first and second embodiments. On the resonator substrate 50, heating elements 55 and sensing elements 57 are integrated e.g. as explained above in connection with the first and second embodiments. However, any other kind, type or structure of heating and sensing elements can be used, which is suitable to be integrated in or on the substrate 50. As a specific example, the heating element(s) 55 and sensing element(s) 57 of FIG. 7 may be implemented by (an) element(s) of a single kind with a sensing and heating function. A suitable temperature control signal 130, e.g. heating voltage or heating current, is generated using a predetermined control routine. A measuring or sensing signal 120 which indicates the measured temperature is generated at the sensing element(s) 57 and supplied to a temperature control unit 100. Based on this sensing signal 120 sampling points SP are derived to obtain the resonator's temperature characteristic. The sampling points SP or a look-up table defining the temperature control characteristic may be stored in a memory device 110, e.g., a RAM or any other re-writable or writable memory, for later control purposes during implementation of the resonator circuit.

It is thus possible to find out dependencies between frequency and temperature by measuring a resonator temperature using integrated sensing elements 57, which may be dedicated elements or heating elements 55 with additional sensing function. The method is quite accurate, because the suggested heating and sensing elements 55, 57 are integrated on the same substrate 50 and thus very close to the resonator itself. Possible variation of characteristics of sensing elements 57, heating elements 55 and/or resonator can be compensated by suitable initial and/or periodical calibration of every sample device.

In summary, a resonator structure, temperature compensation method and temperature control apparatus have been described for controlling local temperature of a resonator structure. At least one heating element is integrated on a substrate of the resonator structure, and a temperature control signal generated based on a stored temperature characteristic is applied to the at least one integrated heating element. Thereby, the at least one heating element and an optional integrated sensing element can be provided very close to the resonator. It is thus possible to control or calibrate variations of sensing elements, heating elements and resonator out from every sample. For example, after calibration, the resonator frequency may be (also) controlled by a phase rotation circuit. The current flowing through the at least one integrated heating element increases the temperature of the resonator. The integrated sensor measures the temperature of the resonator and a factory calibration forces a frequency correction e.g. by adding a controlled phase shifter (e.g. adjustable capacitor network) in the oscillator feedback loop. Corresponding control data may be stored in a RAM table, e.g. phase shifter control bits and/or control voltage versus sensor temperature. Of course, it is possible to control the resonator also during operation, by means of the heating elements.

It is to be noted that the present invention is not restricted to the above embodiments and can be implemented in any integrated circuit structure. Furthermore, the sensing elements of the above first and second embodiments may be combined or exchanged. Moreover, the present invention can be implemented in other BAW based components as well, which are made similar of substrate structures as BAW (example MEMS resonators). The embodiments may thus vary within the scope of the attached claims.

The invention claimed is:

1. A resonator structure integrated on a substrate and comprising:
   a) an acoustically active part;
   b) first and second electrodes arranged on opposite sides of said acoustically active part; and
   c) at least one controllable heating element integrated on said substrate, configured to supply heat to said resonator structure and configured to be controlled based on sampling points gathered by a frequency calibration and stored in a memory.

2. A resonator structure according to claim 1, wherein said controllable heating element is configured to be used as a temperature sensing element for sensing local temperature of said resonator structure.

3. A resonator structure according to claim 1, further comprising a temperature sensing element integrated on said substrate and configured to sense local temperature of said resonator structure.

4. A resonator structure according to claim 3, wherein said temperature sensing element comprises at least one doped region of said substrate.

5. A resonator structure according to claim 1, wherein said at least one controllable heating element comprises at least one doped region of said substrate.

6. A resonator structure according to claim 1, wherein said at least one controllable heating element comprises at least one metal strip pattern integrated on said substrate.

7. A resonator structure according to claim 1, wherein said resonator structure is a bulk acoustic wave resonator structure or a surface acoustic wave resonator structure.

8. A mobile phone device comprising reference oscillator means with a resonator structure as claimed in claim 1.

* * * * *